United States Patent
Tanaka et al.

(10) Patent No.: US 8,476,654 B2
(45) Date of Patent: Jul. 2, 2013

(54) DISPLAY DEVICE

(75) Inventors: Keiichi Tanaka, Osaka (JP); Satoru Kishimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 13 days.

(21) Appl. No.: 13/390,716

(22) PCT Filed: Aug. 5, 2010

(86) PCT No.: PCT/JP2010/063292
§ 371 (c)(1),
(2), (4) Date: Mar. 7, 2012

(87) PCT Pub. No.: WO2011/021510
PCT Pub. Date: Feb. 24, 2011

(65) Prior Publication Data
US 2012/0168785 A1 Jul. 5, 2012

(30) Foreign Application Priority Data
Aug. 20, 2009 (JP) ................. 2009-191330

(51) Int. Cl.
*H01L 29/20* (2006.01)
*H01L 27/15* (2006.01)
*H01L 29/205* (2006.01)
*G02F 1/1343* (2006.01)

(52) U.S. Cl.
USPC ........... 257/89; 257/79; 257/81; 257/91; 349/139

(58) Field of Classification Search
USPC .......... 257/89, 79, 81, 91, 762, E51.022, 257/E33.005, E33.062, E33.063, E33.065; 349/139–152
See application file for complete search history.

(56) References Cited

U.S. PATENT DOCUMENTS

| 7,781,784 | B2 * | 8/2010 | Kim et al. ............ 257/89 |
| 2003/0197189 | A1 * | 10/2003 | Iijima ............ 257/89 |
| 2008/0225218 | A1 | 9/2008 | Lee et al. |
| 2010/0253899 | A1 | 10/2010 | Lee et al. |

FOREIGN PATENT DOCUMENTS

| JP | 58-180053 A | 10/1983 |
| JP | 06-202568 A | 7/1994 |
| JP | 09-211493 A | 8/1997 |
| JP | 2003-287746 A | 10/2003 |
| JP | 2008-225436 A | 9/2008 |

OTHER PUBLICATIONS

Official Communication issued in International Patent Application No. PCT/JP2010/063292, mailed on Oct. 12, 2010.

* cited by examiner

*Primary Examiner* — Julio J Maldonado
*Assistant Examiner* — Cory Eskridge
(74) *Attorney, Agent, or Firm* — Keating & Bennett, LLP (57) ABSTRACT

The present invention provides a display device using a copper wiring and having high display properties in which without preventing a higher aperture ratio of the pixel, coloring of a screen due to reflected light of external light produced within the display device can be prevented. The display device according to the present invention is a display device including a plurality of pixel regions, wherein each of the pixel regions includes a copper wiring containing copper or an alloy thereof, and a red-colored layer and a colored layer of another color; and an area of the copper wiring is smaller in the pixel region including the red-colored layer than in the pixel region including the colored layer of another color, the area of the copper wiring reflecting incident light entering from the display surface side of the display device.

8 Claims, 7 Drawing Sheets

DISPLAY DEVICE

TECHNICAL FIELD

The present invention relates to a display device. More specifically, the present invention relates to a display device for color display including a copper wiring within a pixel region.

BACKGROUND ART

In the field of display devices such as liquid crystal display devices and organic EL displays, high-definition of pixels has been progressed along with a demand for improvement in resolution and reduction in the size of the display device, and a technique for improving an aperture ratio of the pixel has been strongly required.

For example, in the field of an active matrix liquid crystal display device, a liquid crystal display panel having an SHA (Super High Aperture Ratio) structure has been developed. In the liquid crystal display panel having the SHA structure, an interlayer insulation film formed with a special resin is provided on a wiring formed on a TFT (thin film transistor) array substrate, and a pixel electrode is disposed on the interlayer insulation film. Thereby, the aperture ratio is increased, and brighter display is realized.

In the liquid crystal display panel having the SHA structure, delay of a signal passing through the wiring occurs more often as high-definition of pixels is progressed. For this reason, reduction in the resistance of the wiring is demanded, and a metal wiring formed with a metal having a low resistance such as aluminum (Al), copper (Cu), titanium (Ti), and silver (Ag) is used for a wiring material. The wirings of these metals have light shielding properties. Accordingly, in the liquid crystal display panel having the SHA structure, in order to further improve the aperture ratio, a color filter substrate disposed facing the TFT array substrate has no light shielding portion formed in a region in which the light can be shielded by the metal wiring. Moreover, such a configuration reduces an uneven aperture ratio to be caused by deviation of the color filter substrate and the TFT array substrate bonded to each other.

The metal wiring has a high light reflectance. For this, when the display device using the metal wiring is used in a bright room, for example, the light entering from the outside of the display device to the inside thereof may reflect on the surface of the metal wiring to give an influence to display properties. For this reason, in order to reduce such reflected light of the external light, a method of covering a wiring with a film having a lower reflectance (for example, see Patent Document 1.), and a method of providing a light shielding portion in a part where light shielding is necessary (for example, see Patent Document 2.) have been proposed. Moreover, in the liquid crystal display device, a configuration is widely used in which a light shielding portion is provided on the side of the color filter substrate disposed facing the TFT array substrate.

[Patent Document 1] Japanese Kokai Publication No. S-58-180053 (JP-A S-58-180053)
[Patent Document 2] Japanese Kokai Publication No. H-9-211493 (JP-A H-9-211493)

DISCLOSURE OF INVENTION

Problems to be Solved by the Invention

Unfortunately, in the method according to Patent Document 1, the wiring is further covered with a film, leading to increase in the number of film formation steps and increase in manufacturing cost. Moreover, the method of forming a light shielding portion in a substrate with a wiring formed thereon as described in Patent Document 2 not only makes the production process complicated, but also inhibits improvement in the aperture ratio of the pixels. Further, if the light shielding portion is provided on the side of the color filter substrate, an uneven aperture ratio may be caused by the deviation of the color filter substrate and the TFT array substrate bonded to each other. Accordingly, the method is not suitable for a display device of which a higher aperture ratio is demanded, such as the liquid crystal display panel having the SHA structure.

In the display device of which a higher aperture ratio is demanded, use of a wiring formed with copper (hereinafter, also referred to as a copper wiring) among the metal wirings described above is demanded. This is because copper is a low-resistance material having a resistivity of about 60% of that of aluminum; therefore, a copper wiring can reduce the delay of the signal well. Copper also has a high resistance against electromigration, a phenomenon that metal atoms are moved by collision of electrons when the current flows. Accordingly, a highly reliable display device in which the disconnection hardly occurs can be realized.

In the display device using the copper wiring, however, in the case where the surface of the wiring is not covered with the light shielding portion or the like as in the liquid crystal display panel having the SHA structure, the screen of the display device may become reddish due to the influence of the reflected light caused by the external light. The reason is as follows. The metal wiring formed with aluminum or titanium has a substantially uniform reflectance in a visible light region (wavelength of 380 nm to 780 nm). For this reason, even when the reflected light is produced within the display device, coloring of the screen due to the reflection of the light of only a specific color is less likely to occur. On the other hand, the copper wiring has a high reflectance to the light at a long wavelength (600 nm to 780 nm). The light of the long wavelength is reddish light, and often makes the screen reddish.

Thus, the liquid crystal display panel using the copper wiring has a problem in suppression of the coloring of the screen while the aperture ratio of the pixel is increased.

The present invention has been made in consideration of such circumstances, and an object of the present invention is to provide a display device having high display properties, even with a copper wiring used therein, in which coloring of a screen due to reflected light of external light produced within the display device can be prevented without inhibiting improvement in the aperture ratio of the pixel.

Means to Solve the Problems

As a result of extensive research on the display device using a copper wiring, the present inventors noticed that a screen becomes reddish by reflection of external light on the surface of the wiring. The present inventors found out that the phenomenon occurs not only because copper has a high reflectance to the light at a long wavelength, but also because a red-colored layer provided in the display device has a high transmittance to the light at a longer wavelength. Accordingly, the present inventors arrived at making, concerning the area of the copper wiring that reflects the external light, the area of the wiring in a pixel region including the red-colored layer smaller than that of a pixel region including a colored layer of another color; thereby, the coloring of the screen can be reduced, and a display device having high display properties can be obtained. Thus, the present inventors solved the problem to achieve the present invention.

Namely, the present invention is a display device including a plurality of pixel regions, wherein each of the pixel regions includes a copper wiring containing copper or an alloy thereof, and a red-colored layer and a colored layer of another color; and an area of the copper wiring is smaller in the pixel region including a red-colored layer than in the pixel region including the colored layer of another color, the area of the copper wiring reflecting incident light entering from the display surface side of the display device.

In the present invention, the copper wiring is a wiring including a layer formed with copper or an alloy thereof on the display surface side. Examples of the copper alloy include an alloy of copper and magnesium (Mg) and an alloy of copper and manganese (Mn). The magnesium or manganese content is preferably from several percent to not more than 50%. Alternatively, a multilayer film can be used in which a layer formed with copper oxide (CuO) or copper nitride (CuN) is stacked on the layer formed with Cu. In this case, the external light reflects on the surface of the layer formed with CuO or CuN. Alternatively, the copper wiring may be formed on the display surface side of a layer formed with a high work function metal such as gold (Au) and platinum (Pt). Further, a layer formed with a conductive material having a high light transmittance may be stacked on the display surface side of the copper wiring, and examples of the conductive material include transparent conductive materials such as ITO (Indium-Tin-Oxide), IZO (Indium-Zinc-Oxide), IDIXO (indium oxide-indium zinc oxide $In_2O_3(ZnO)n$), and $SnO_2$.

The colored layer is provided for color display. In the present invention, as long as the red-colored layer is included, other colors are not particularly limited. Usually, the display device includes at least three colored layers of red, green, and blue, and each of the colored layers passes visible light at a predetermined wavelength. Thus, the color display can be implemented. Specifically, the red-colored layer is likely to pass the light at a wavelength of approximately not less than 620 nm and not more than 680 nm; the green-colored layer is likely to pass the light at a wavelength of approximately not less than 520 nm and not more than 580 nm; and the blue-colored layer is likely to pass the light at a wavelength of approximately not less than 420 nm and not more than 480 nm.

In the present invention, the coloring of the screen includes not only coloring produced at black display when the display device is in the ON state, but also coloring produced by reflection in the OFF state of the display device. Reduction in such coloring realizes a sensory sharp black display. The OFF state where the display device is not turned on refers to a state where the backlight is not turned on, the liquid crystal display panel is not driven, and the display device is only left as it is in the case of the liquid crystal display device, for example.

In the present invention, the area of the wiring refers to the area of the copper wiring in which the incident light entering from the display surface side of the display device can be reflected and emitted to the outside of the display device. The area of the wiring is made smaller in the pixel region including a red-colored layer (hereinafter, also referred to as a red pixel region.) than in the pixel region including the colored layer of a color other than red (hereinafter, also referred to as a pixel region of another color.). The areas of the wirings in the pixel regions of other colors may be the same as or different from each other, provided that the areas are larger than that of the red pixel region. Such a configuration reduces the amount of the reflected light produced in the red pixel region and reduces the amount of the reflected light passing through the red-colored layer. Accordingly, the reddishness of the screen can be reduced well. If the external light reflects on the surface of the copper wiring in the pixel region of another color, the reflected light is difficult to pass through the colored layer of the color because the reflected light has a long wavelength. Accordingly, the reddishness of the screen is hardly produced.

In one embodiment of the display device according to the present invention, the pixel region further includes a light shielding portion for shielding the incident light on the display surface side with respect to the copper wiring, wherein the area of the copper wiring not overlapping the light shielding portion when a display surface is viewed from a normal direction is smaller in the pixel region including the red-colored layer than in the pixel region including the colored layer of another color. The light shielding portion to be provided also inhibits improvement in the aperture ratio of the pixel. Accordingly, the area of the light shielding portion is preferably as small as possible.

More preferably, the proportion of the area of the wiring in the pixel region including the red-colored layer is 0.6 to 0.8 wherein the area of the wiring in the pixel region including the colored layer of another color is 1, because deviation of color difference can be reduced.

In another embodiment according to the present invention, an average width of the copper wiring is narrower in the pixel region including the red-colored layer than in the pixel region including the colored layer of another color. Such a configuration also reduces the area of the wiring in the red pixel region as in the case of the embodiment above.

In the present invention, the display device includes an array substrate with the copper wiring formed thereon, and a color filter substrate with the colored layer and the light shielding portion formed thereon. Specifically, the copper wiring is a wiring for driving pixels provided in the array substrate. Examples of such a copper wiring include a storage capacitor wiring and a gate wiring.

The configuration of the display device of the present invention is not especially limited by other components as long as it essentially includes such components.

The aforementioned modes may be employed in appropriate combination as long as the combination is not beyond the scope of the present invention.

Effect of the Invention

According to the display device of the present invention, even in the display device using the copper wiring, without inhibiting improvement in the aperture ratio of the pixel, the coloring of the screen due to the reflected light of the external light produced within the display device can be suppressed, and a display device having high display properties can be achieved.

MODE FOR CARRYING OUT THE INVENTION

The present invention will be mentioned in more detail referring to the drawings in the following embodiments, but is not limited to these embodiments.

Embodiment 1

In the present embodiment, using FIGS. 1 to 6, a description is given on an embodiment of a liquid crystal display device including color filter (CF) layers of three colors of red (R), blue (B), and green (G) wherein the area of the copper wiring is controlled by a light shielding portion.

Figure 1:
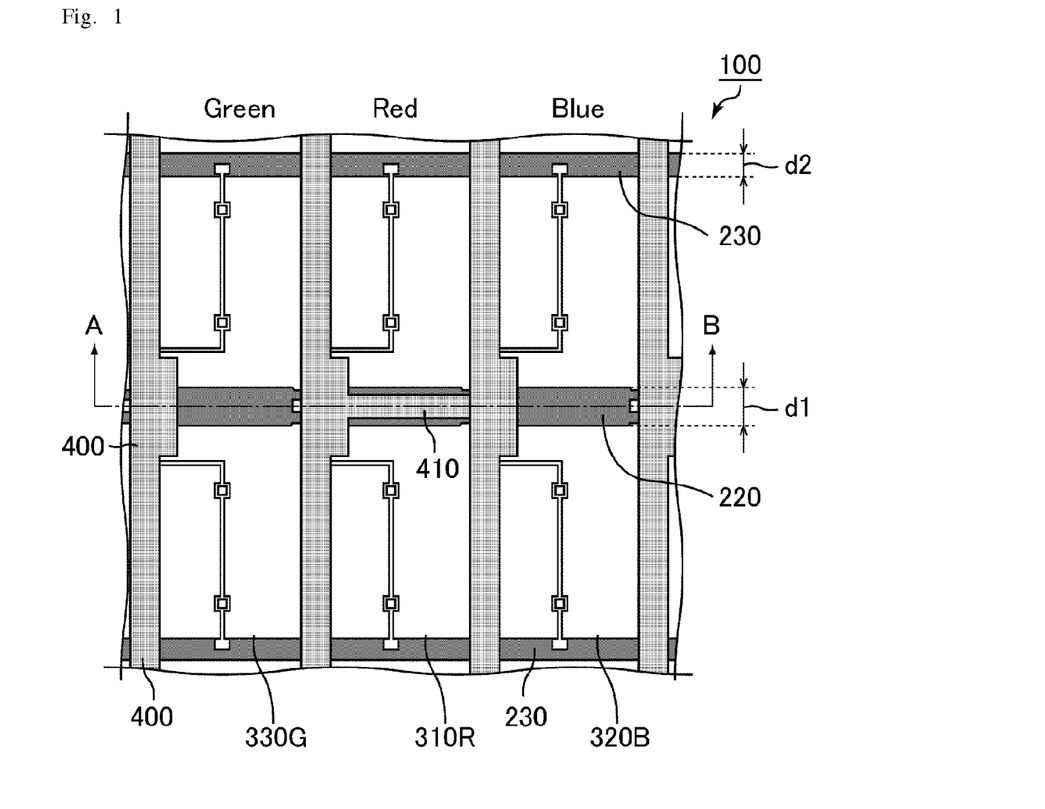
[FIG. 1] is a schematic plan view showing a configuration of pixels in a liquid crystal display device according to Embodiment 1.
Figure 2:
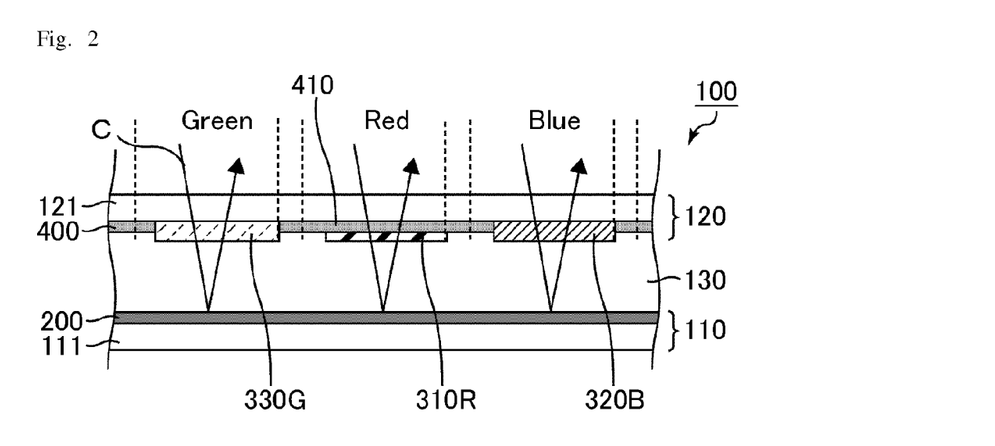
[FIG. 2] is a schematic cross-sectional view taken along a line A-B in FIG. 1.
Figure 3:
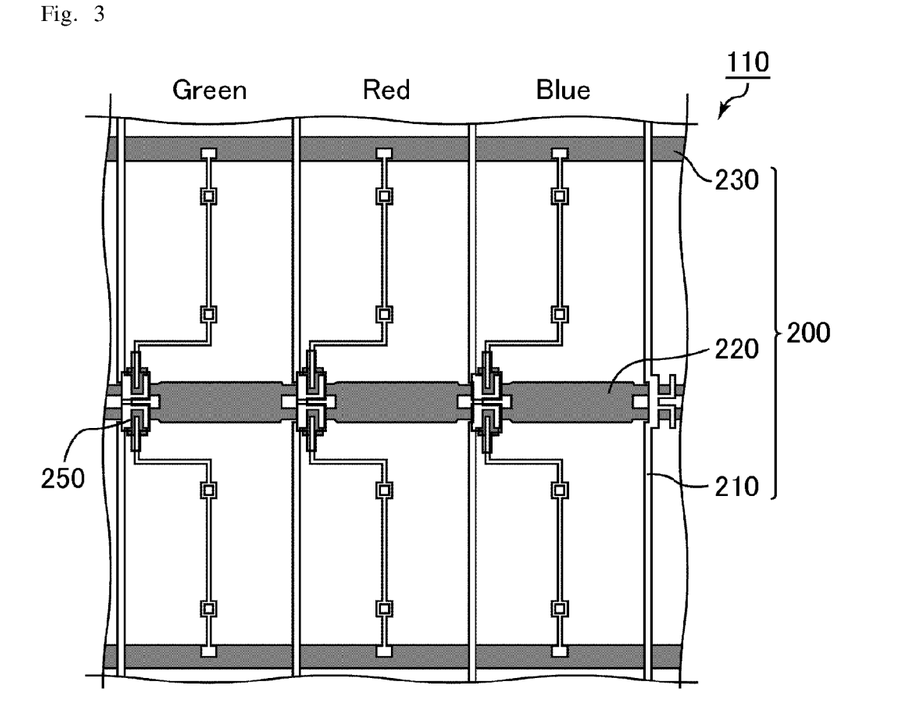
[FIG. 3] is a schematic plan view showing a configuration of a TFT array substrate according to Embodiment 1.
Figure 4:
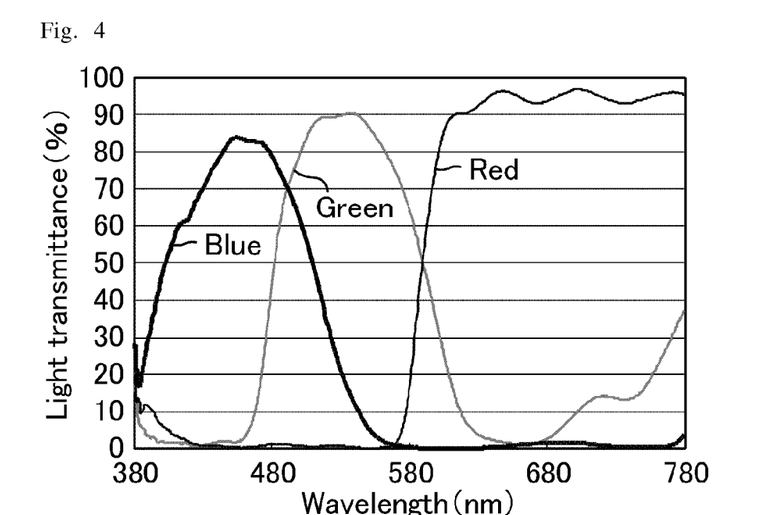
[FIG. 4] is a graph showing a relationship between the wavelength of light and the light transmittance in each of color filter layers.
Figure 5:
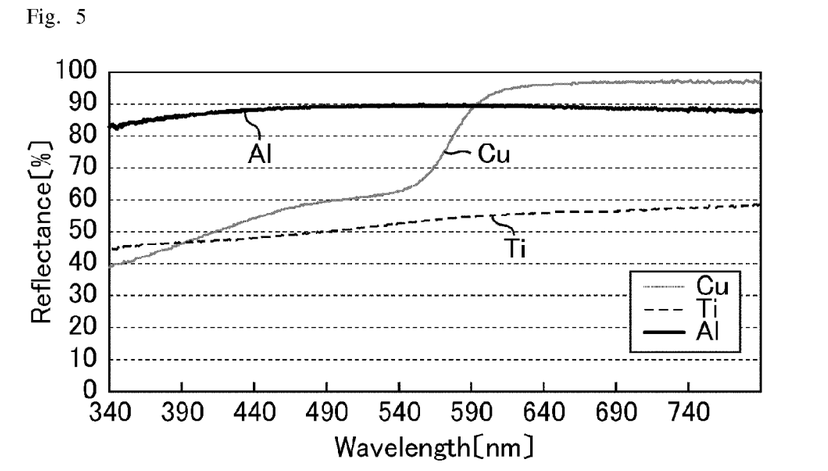
[FIG. 5] is a graph showing a relationship between the wavelength of light and the light reflectance in each of the metals that form a wiring.
Figure 6:
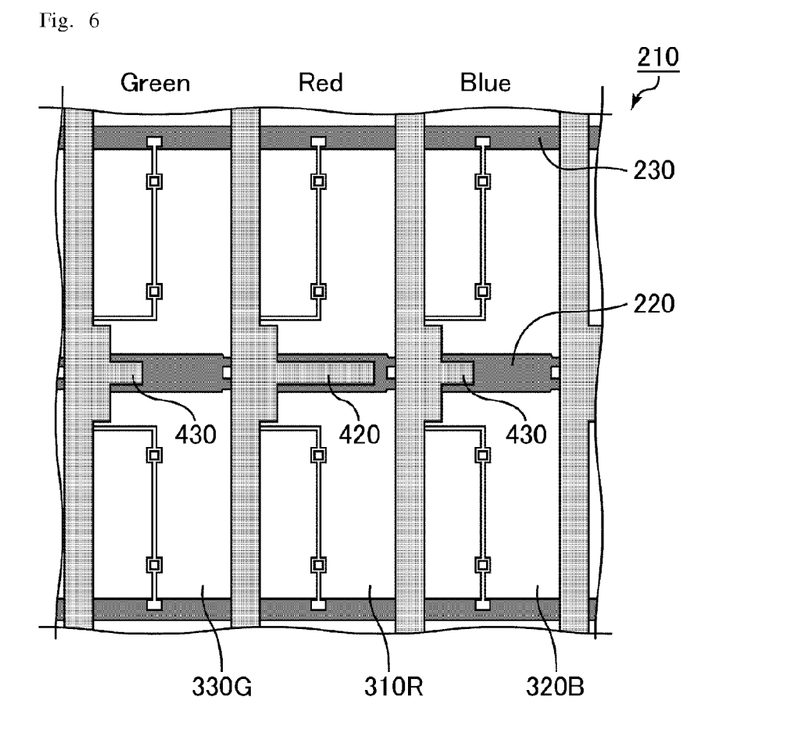
[FIG. 6] is a schematic plan view showing a configuration of pixels with a light shielding portion different from that shown in FIG. 1 in Embodiment 1.

FIG. 1 is a schematic plan view showing a configuration of pixels in a liquid crystal display device according to Embodiment 1. FIG. 2 is a schematic cross-sectional view taken along a line A-B in FIG. 1. FIG. 3 is a schematic plan view showing a configuration of a TFT array substrate. FIG. 4 is a graph showing a relationship between the wavelength of light and light transmittance in each of the color filter layers. FIG. 5 is a graph showing a relationship between the wavelength of light and the light reflectance in each of the metals that form a wiring. FIG. 6 is a schematic plan view showing a configuration of pixels with a light shielding portion different from that shown in FIG. 1.

As shown in FIGS. 1 and 2, a liquid crystal display device 100 includes a TFT array substrate 110 with a copper wiring containing copper or an alloy thereof; a CF substrate 120 disposed facing the TFT array substrate 110 as a counter substrate; and a liquid crystal layer 130 interposed between the TFT array substrate and the CF substrate. Various members provided in the liquid crystal display device 100, such as a light source and a casing, are not shown.

The TFT array substrate 110 includes a copper wiring 200 for driving pixels disposed on the main surface of a glass substrate 111. As shown in FIG. 3, the copper wiring 200 includes a source line 210, a gate line 220, and a storage capacitor wiring (Cs wiring) 230. The source line 210 and the gate line 220 are disposed on the main surface of the glass substrate 111 in a lattice pattern. The Cs wiring 230 is disposed between the adjacent gate lines 220 parallel thereto. In each of pixel regions defined by the source lines 210 and the gate lines 220, a TFT 250 as a switching element is formed in the vicinity of the intersection of the source line 210 and the gate line 220.

In the CF substrate 120, a CF layer 310R of red (R), a CF layer 320B of blue (B), and a CF layer 330G of green (G) are disposed in the corresponding pixel regions on the main surface of a glass substrate 121. A light shielding portion 400 referred to as a black matrix partitions the CF layers 310R, 320B, and 330G.

In the thus-configured liquid crystal display device 100, as shown by the arrow C in FIG. 2, the external light of a fluorescent lamp and the like passes from the display surface side through the CF layers 310R, 320B, and 330G and enters the display device. Next, the external light passes through the liquid crystal layer 130 and reflects on the surface of the copper wiring 200. The reflected light again passes through the liquid crystal layer 130 and the CF layers 310R, 320B, and 330G, and is emitted to the outside.

Thus, the incident light passes through the CF layer 310R, 320B, or 330G twice, and therefore, greatly receives the influences of the CF layer 310R, 320B, and 330G. As shown in FIG. 4, the CF layers 310R, 320B, and 330G each have different light transmittances. Specifically, the light at a wavelength of approximately not less than 620 nm and not more than 680 nm is likely to pass through the CF layer 310R, the light at a wavelength of approximately not less than 520 nm and not more than 580 nm is likely to pass through the CF layer 330G, and the light at a wavelength of approximately not less than 420 nm and not more than 480 nm is likely to pass through the CF layer 320B.

Moreover, the copper wiring 200 has reflection properties different from those of a metal material such as aluminum and titanium. As shown in FIG. 5, the copper wiring 200 has a lower reflectance to the light at a wavelength of approximately 340 nm to 540 nm. The reflectance is gradually increased in a wavelength range of approximately 540 nm to 590 nm. The copper wiring 200 has a higher reflectance to the light at a wavelength of more than 600 nm. Namely, the light at a long wavelength, i.e., reddish light is likely to be reflected on the surface of the copper wiring 200. Contrary to this, the wiring formed with aluminum or titanium shows a substantially constant reflectance to the light from the short wavelength to the long wavelength, and does not reflect the light of a specific color.

Accordingly, because of the properties that the CF layers 310R, 320B, and 330G have and the properties that the copper wiring 200 has, the light at the long wavelength is likely to pass through the CF layer 310R in the pixel region including the CF layer 310R (hereinafter, also referred to as a red pixel region R.). The light passing through the CF layer 310R is likely to be reflected on the surface of the copper wiring 200. Further, the reflected light is likely to pass through the CF layer 310R to be emitted to the outside of the display device. Thereby, the screen is likely to become reddish.

The light reflected on the surface of the copper wiring 200 is reflected on the surface of the copper wiring 200 not overlapping the light shielding portion 400 when the display surface is viewed in the normal direction. In the liquid crystal display device 100 shown in FIG. 1, all the source lines 210 are covered with the light shielding portion 400. Accordingly, the light reflects on the surface of the copper wiring 200 in which the gate line 220 and the Cs wiring 230 do not overlap the light shielding portion 400.

Here, in the present embodiment, the area of the copper wiring that reflects the external light is made smaller in the red pixel region R than in the pixel region including the CF layer 320B and that including the CF layer 330G (hereinafter, also referred to as a blue pixel region B and a green pixel region G.).

Specifically, a light shielding portion 410 is provided in a region overlapping the gate line 220 having a wider average width when the display surface is viewed in the normal direction. Thereby, the area of the copper wiring 200 is controlled. The light shielding portion 410 is provided between the adjacent light shielding portions 400 formed on the CF substrate 120. Such a simple configuration can make the area of the copper wiring 200 smaller in the red pixel region R than in the blue pixel region B and in the green pixel region G when the display surface is viewed in the normal direction.

Alternatively, as in a liquid crystal display device 210 shown in FIG. 6, the light shielding portion 410 that controls the area of the copper wiring 200 may have a configuration in which the length of a light shielding portion 420 provided in the red pixel region R is shorter and the area is smaller than that of the light shielding portion 410 shown in FIG. 1; and a light shielding portion 430 partially overlapping the gate line 220 when the display surface is viewed in the normal direction is further provided in the blue pixel region B and the green pixel region G. Such a configuration also makes the area of the wiring in the red pixel region R smaller than that in the blue pixel region B and that in the green pixel region G, leading to reduction in the coloring of the screen.

Hereinafter, the present embodiment will be described using specific examples.

EXAMPLE 1

In Example 1, a 53-type liquid crystal display device was used as the liquid crystal display device 100 shown in FIG. 1. The resolution was that of the full high definition resolution (1920 wide×1080 height), and the pixel pitch was 600 μm×200 μm. The average width d1 of the gate line 220 was 30 μm, and the average width d2 of the Cs wiring 230 was 15 μm. Further, in the red pixel region R, the average width of the light shielding portion 410 that covered the gate line 220 was 16.5 μm.

Thereby, in the blue pixel region B and the green pixel region G, the area of the wiring is the sum of the area of the wiring of the gate line 220 (200 μm×30 μm=6000 μm²) not overlapping the light shielding portion 400 and the area of the wiring of the Cs wiring 230 (200 μm×15 μm=3000 μm²), i.e., 9000 μm².

On the other hand, in the red pixel region R, the light shielding portion 410 is provided in the region partially overlapping the gate line 220. For this reason, the area of the light shielding portion is 13 μm×200 μm=2600 μm² larger than that in the blue pixel region B and that in the green pixel region G. Then, the area of the copper wiring 200 not overlapping the light shielding portions 400 and 410 is 6400 μm² (9000 μm²−2600 μm²=6400 μm²).

From the result, the ratio of the area of the copper wiring 200 in the respective pixel regions was G:B:R=1:1:0.7. The screen in the liquid crystal display device 100 was visually observed. The reddishness was not found.

The hue (CIE-y, CIE-x) of the obtained liquid crystal display device 100 was compared to that of a liquid crystal display device having the same configuration as that in Example 1, but including a wiring formed with aluminum. In the liquid crystal display device using the aluminum wiring, the ratio of the area of the copper wiring 200 in the respective pixel regions was changed from G:B:R=1:1:0.5 to G:B:R=1:1:1, and six points were measured. The obtained measurement result is shown in FIG. 7.

Figure 7:
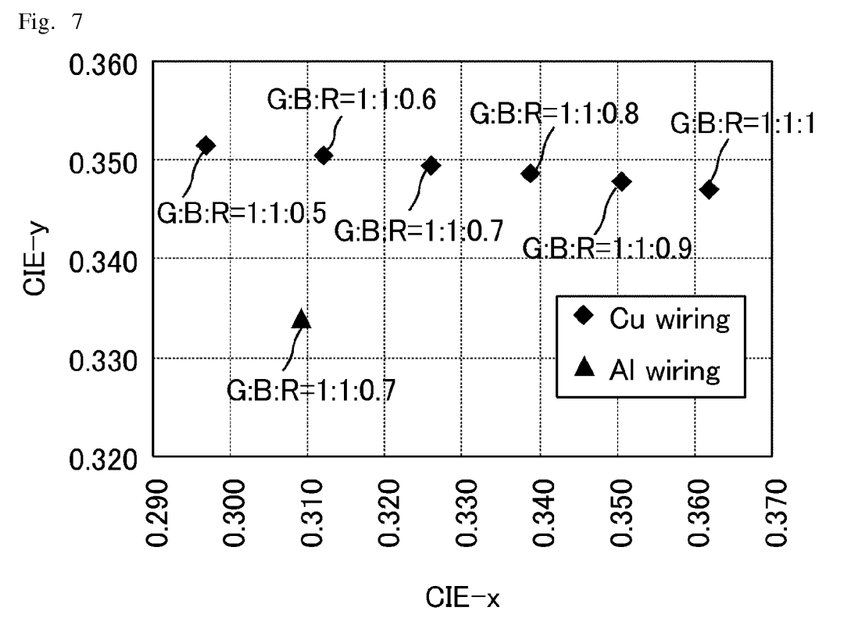
[FIG. 7] is a graph showing hues of a copper wiring and an aluminum wiring according to Example 1.

FIG. 7 is a graph showing the hues of the copper wiring and the aluminum wiring according to Example 1. In the graph, the CIE-x axis indicates that the color is more bluish as the value is smaller and the color is more reddish as the value is larger. The CIE-y axis indicates that the color is more greenish as the value is smaller and the color is more bluish as the value is larger.

From the measurement result shown in FIG. 7, it was found that in the liquid crystal display device 100 according to Example 1, the color of the reflected light is close to that in the liquid crystal display device using the aluminum wiring when the ratio of the area of the copper wiring 200 in the respective pixel regions is G:B:R=1:1:0.6 to G:B:R=1:1:0.7.

Moreover, in the liquid crystal display device 100, the color difference ($\Delta Ea*b*$) when the ratio of the area of the copper wiring 200 in the respective pixel regions was changed from G:B:R=1:1:0.5 to G:B:R=1:1:1 was measured at six points. The obtained measurement result is shown in FIG. 8.

Figure 8:
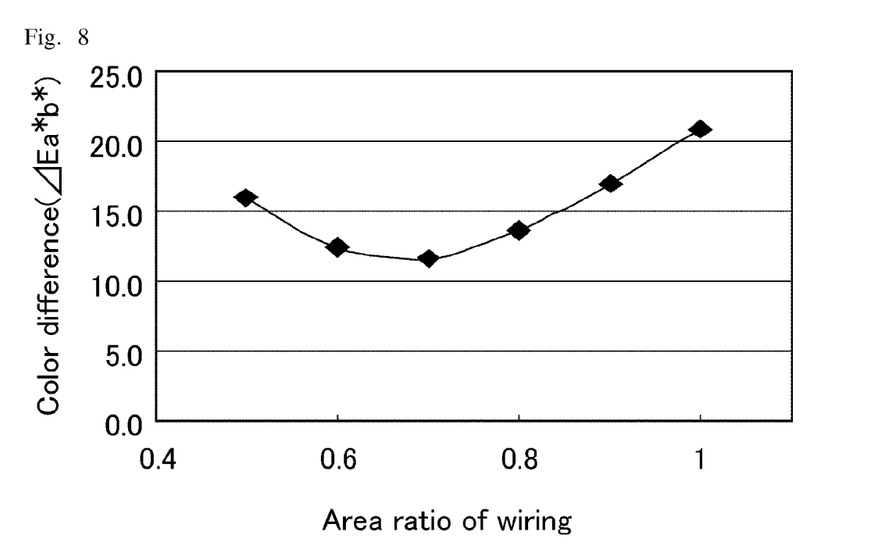
[FIG. 8] is a graph showing a relationship between the area ratio of the wiring and a color difference according to Example 1.

FIG. 8 is a graph showing the relationship between the ratio of the area of the wiring and the color difference in the liquid crystal display device 100 according to Example 1. As shown in the graph, when the ratio of the area of the copper wiring 200 in the red pixel region R to that in the blue pixel region B was 0.7 and the ratio of the area of the copper wiring 200 in the red pixel region R to that in the green pixel region G was 0.7, the color difference was the minimum value. In the liquid crystal display device 100 having the color difference in the range of 0.6 to 0.8, the reddishness of the screen caused by the reflected light was suppressed, and good display properties were obtained.

At a color difference of 0.7, when the liquid crystal display device 100 was placed in a bright place with the external light such as a living room, for example, the reddishness was suppressed particularly at the black display, and a sharp black color could be sensed. The liquid crystal display device 100 also had a good display property.

In FIG. 8, when the ratio of the area of the copper wiring 200 in the respective pixel regions is 1, namely G:B:R=1:1:1, the color difference is larger. The configuration corresponds to Comparative Example 1 in Examples. Comparative Example 1 will be described using FIGS. 9 and 10.

COMPARATIVE EXAMPLE 1

Figure 9:
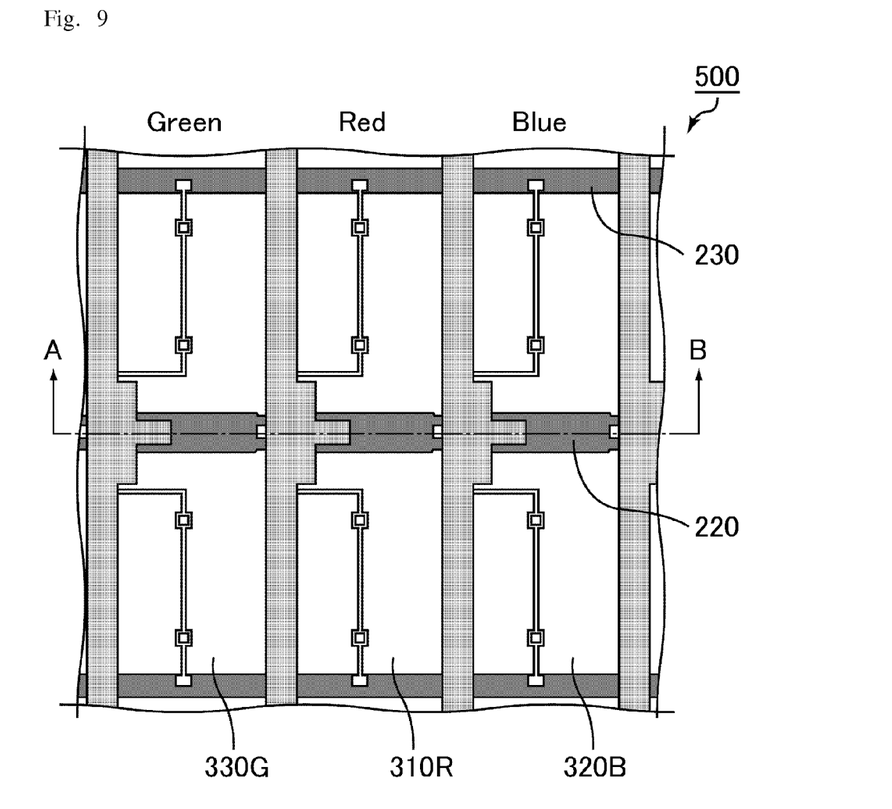
[FIG. 9] is a schematic plan view showing a configuration of pixels in a liquid crystal display device according to Comparative Example 1.
Figure 10:
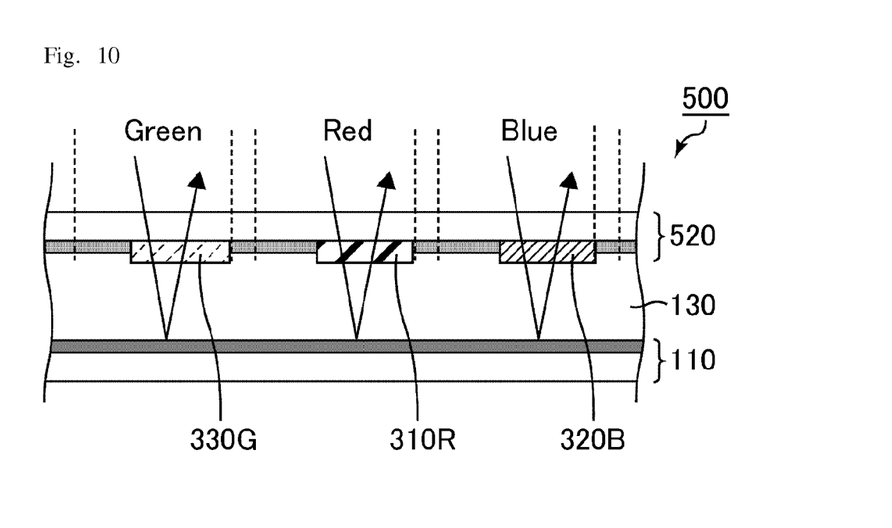
[FIG. 10] is a schematic cross-sectional view showing a configuration of pixels in the liquid crystal display device according to Comparative Example 1, and taken along a line A-B in FIG. 9.

FIGS. 9 and 10 show a configuration of pixels in a liquid crystal display device according to Comparative Example 1. FIG. 9 is the schematic plan view, and FIG. 10 is the schematic cross-sectional view taken along the A-B in FIG. 9. In Comparative Example 1, a liquid crystal display device 500 will be described in which the area of the copper wiring is not controlled.

As shown in FIGS. 9 and 10, when the display surface is viewed in the normal direction, the pixel regions including the CF layers 330G, 320B, and 310R have the same area of the copper wiring 200. Accordingly, the reddishness of the screen is caused by the reflected light produced in the red pixel region R as described above. This is also supported by the result in FIG. 7 showing that the numeric value of the hue (CIE-x) is large when the ratio of the area of the copper wiring 200 is G:B:R=1:1:1, and the hue is on the red side.

Embodiment 2

In the above embodiment, the light shielding portion overlapping the gate line 220 when the display surface is viewed in the normal direction is provided to control the area of the wiring in the red pixel region R. In the present embodiment, a light shielding portion overlapping the Cs wiring 230 is provided to control the area of the wiring.

Figure 11:
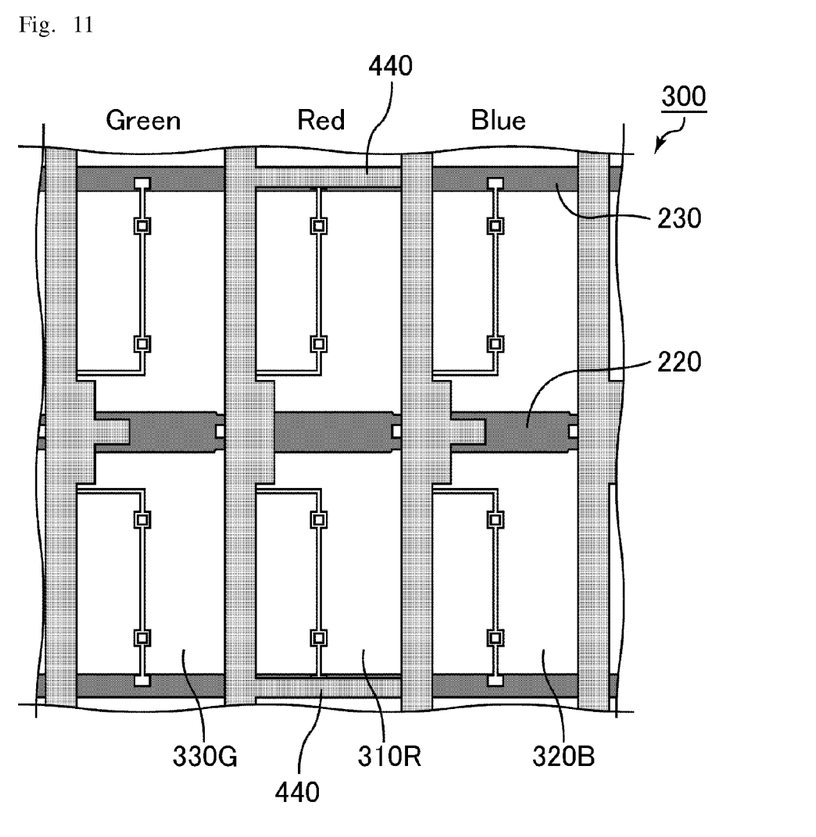
[FIG. 11] is a schematic plan view showing a configuration of pixels in a liquid crystal display device according to Embodiment 2.

FIG. 11 is a schematic plan view showing a configuration of pixels in a liquid crystal display device 300 according to the present embodiment. In FIG. 11, of the copper wiring in the red pixel region R, a light shielding portion 440 is provided in a region overlapping the Cs wiring 230.

With such a configuration, the area of the copper wiring in the red pixel region R is smaller than that in the blue pixel region B and that in the green pixel region G. For this reason, the same effect as that in the above Embodiment 1 is obtained. In addition to the configuration according to the present Embodiment, the configuration according to Embodiment 1 may be further added. Namely, the light shielding portion may be provided in the region overlapping both the Cs wiring 230 and the gate line 220.

The above embodiments have been described using an example in which the light shielding portion is provided in the region overlapping the copper wiring 200 for driving pixels when the display surface is viewed in the normal direction, but the present invention will not be limited to this. In the case where a copper wiring other than the copper wiring 200 for driving pixels exists, the light shielding portion may be provided on a region overlapping the copper wiring to control the area of the wiring.

Embodiment 3

In the above embodiments, the light shielding portion overlapping the copper wiring 200 is provided in the red pixel region R to control the area of the wiring. In the present embodiment, the shape of the copper wiring 200 is changed to control the area of the wiring.

Figure 12:
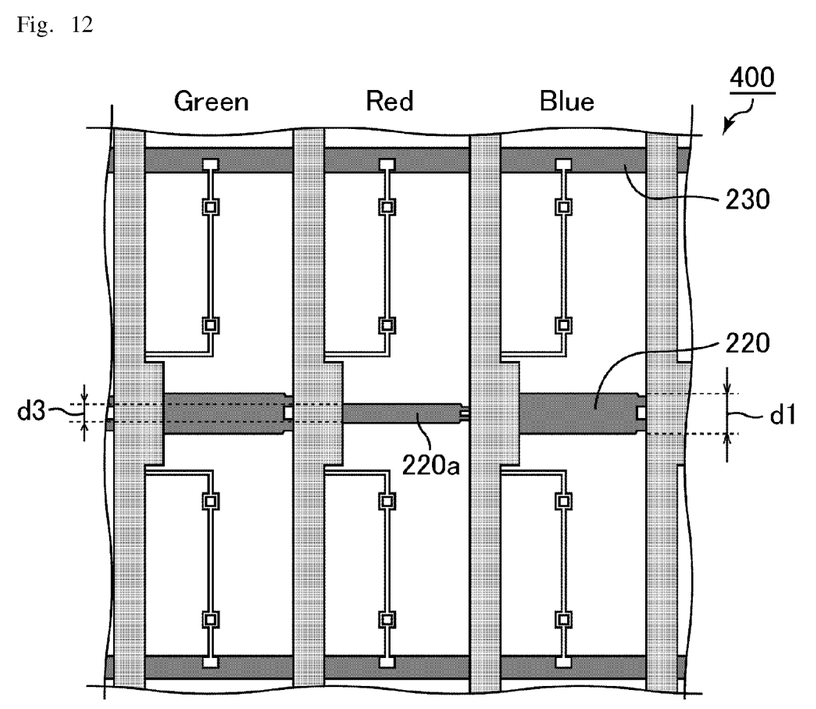
[FIG. 12] is a schematic plan view showing a configuration of pixels in a liquid crystal display device according to Embodiment 3.

FIG. 12 is a schematic plan view showing a configuration of pixels in a liquid crystal display device 400 according to the present embodiment. In FIG. 12, of the copper wiring in the red pixel region R, the average width d3 of the gate line 220a is narrower than the average width d1 of the gate line 220 in the blue pixel region B and the green pixel region G. The average width d3 of the gate line 220a is not particularly limited.

Thereby, the area of the copper wiring in the red pixel region R is made smaller than that in the blue pixel region B and that in the green pixel region G. Such a configuration can reduce the reflected light in the red pixel region R, leading to suppression of the coloring of the screen.

Moreover, the average width d3 of the gate line 220a can be easily controlled only by changing a mask pattern when the gate line 220 is patterned. Reduction in the width of the wiring leads to an increased resistance value. As described above, however, copper is a material having a resistance extremely lower than that of aluminum or titanium. Accordingly, unevenness of luminance to be caused by delay of response of the signal is not produced, and the coloring of the screen can be suppressed. Further, in the configuration according to the present embodiment, the light shielding portion does not need to be increased. For this, a higher aperture ratio of the pixel can be achieved.

In the present embodiment as well as in the above embodiments, in the area of the copper wiring 200, the proportion of the area of the wiring in the red pixel region R is preferably 0.6 to 0.8 wherein the area of the copper wiring in the blue pixel region B is 1 and that in the green pixel region G is 1.

Moreover, the configuration in which the width of the wiring is reduced in order to reduce the area of the copper wiring 200 in the red pixel region R is not limited to that in which the width of the wiring of the gate line 220a is reduced. The width of the wiring of the source line 210 and/or the Cs wiring 230 may be reduced.

Moreover, in a combination of the configuration according to the present embodiment and those according to the above Embodiments 1 and 2, the area of the copper wiring 200 in the red pixel region R can be reduced.

The above embodiments have been described using an example in which the liquid crystal display device includes three color filter layers of red (R), blue (B), and green (G), but the present invention will not be limited to this. Any color filter layers of two or more colors including at least red (R) may be used. As an example, a liquid crystal display device including four color filter layers of red (R), blue (B), green (G), and yellow (Y) may be used.

The above embodiments have been described using the liquid crystal display device as an example, but the present invention will not be limited to this. The present invention can be used for display devices using a copper wiring such as organic EL display devices, plasma display devices, and field emission display devices.

The modes of the aforementioned embodiments may be employed in appropriate combination as long as the combination is not beyond the scope of the present invention.

The present application claims priority to Patent Application No. 2009-191330 filed in Japan on Aug. 20, 2009 under the Paris Convention and provisions of national law in a designated State, the entire contents of which are hereby incorporated by reference.

EXPLANATION OF NUMERALS AND SYMBOLS 100, 210, 300, 500 Liquid crystal display device
111, 121 Glass substrate
110 TFT array substrate
120 CF substrate
130 Liquid crystal layer
200 Copper wiring
210 Source line
220, 220a Gate line
230 Cs wiring
250 TFT
310R, 320B, 330G CF layer
400, 410, 420, 430, 440 Light shielding portion

The invention claimed is:

1. A display device including a plurality of pixel regions, wherein each of the pixel regions comprises a copper wiring containing copper or an alloy thereof; and a red-colored layer and a colored layer of another color, and
the area of the copper wiring is smaller in a pixel region including the red-colored layer than in a pixel region including the colored layer of another color, the area of the copper wiring reflecting incident light entering from a display surface side of the display device.

2. The display device according to claim 1,
wherein the pixel region further comprises a light shielding portion for shielding the incident light on a display surface side with respect to the copper wiring, and
the area of a portion in the copper wiring not overlapping the light shielding portion when the display surface is viewed in a normal direction is smaller in the pixel region including the red-colored layer than in the pixel region including the colored layer of another color.

3. The display device according to claim 1,
wherein an average width of the copper wiring is narrower in the pixel region including the red-colored layer than in the pixel region including the colored layer of another color.

4. The display device according to claim 1,
wherein the proportion of the area of the wiring in the pixel region including the red-colored layer is 0.6 to 0.8 wherein the area of the wiring in the pixel region including the colored layer of another color is 1.

5. The display device according to claim 2,
wherein the display device comprises an array substrate with the copper wiring formed thereon, and a color filter substrate with the colored layers and the light shielding portion formed thereon.

6. The display device according to claim 5,
wherein the copper wiring is a wiring for driving pixels provided in the array substrate.

7. The display device according to claim 6,
wherein the copper wiring is a storage capacitor wiring.

8. The display device according to claim 6,
wherein the copper wiring is a gate wiring.

* * * * *